July 15, 1969 B. E. ATTWOOD 3,456,150

TIME-BASE

Filed Jan. 3, 1966 2 Sheets-Sheet 1

INVENTOR.
BRIAN E. ATTWOOD
BY
Frank R. [signature]
AGENT

INVENTOR.
BRIAN E. ATTWOOD
BY
Frank R. Trifari
AGENT 3,456,150
TIME-BASE

Brian Ernest Attwood, Horley, England, assignor, by mesne assignments, to U.S. Philips Corporation, New York, N.Y., a corporation of Delaware
Filed Jan. 3, 1966, Ser. No. 518,253
Claims priority, application Great Britain, Jan. 15, 1965, 2,010/65
Int. Cl. H01j 29/76
U.S. Cl. 315—27 6 Claims

ABSTRACT OF THE DISCLOSURE

A time-base system for a television system includes means for converting a sawtooth signal to a pulse width modulated signal for application to the deflection coils, so that the deflection output system operates in the switching mode. The conversion may be accomplished by applying a sawtooth voltage and a sine wave voltage to the input electrodes of a transistor.

This invention relates to a field time-base circuit arrangement comprising in combination an output stage having at least one semiconductor and a field deflection coil, a charge circuit including a charging capacitor across which a sawtooth control voltage occurs during scanning stroke periods, an oscillator having a discharge circuit connected across said capacitor for periodically discharging the capacitor during flyback periods. More especially such a field time-base circuit arrangement is suitable for use with magnetic beam deflection in a cathode-ray tube of a television receiver.

A conventional semiconductor field time-base usually has three stages, a sawtooth voltage generator, a driver and an output stage. In such a circuit the second and third stages operate in Class A. The output stage uses a power transistor coupled to the deflection coils through a choke or a transformer.

A typical dissipation value for the output stage is 6 w. for a 25 kv. 90° colour tube. Recently Class B output stages have been developed in which the choke or transformer is no longer needed and, as a result, the efficiency is increased. However, power transistors are still needed in the output stage and a typical nominal mean dissipation is about 1.5 w. for each transistor (total 3 w.) for a similar colour tube.

It is the principal object of the present invention to provide an improved field time-base circuit arrangement capable of utilizing semiconductor devices at much lower rates of power dissipation so as to permit the use of much smaller and cheaper devices.

In order to achieve this, the field time-base circuit arrangement according to the invention is characterized by means for converting said sawtooth control voltage to a series of pulses having varying width related to the amplitude of the sawtooth voltage and applying said pulses to said output stage in which output an integrating network is connected including said field deflection coil.

In preferred arrangements applied to interlaced raster displays of the television type, the invention is further characterized in that the frequency of the pulses is equal to an even harmonic of the line-scan frequency. The semiconductor devices may, for example, be 4-layer transistors or they may be transistors operated as switches, i.e. operated in such manner that they are either off or bottomed.

It has been found that, in contrast with a time-base operating in Class A or Class B, a field time-base which, as previously stated, is operated as a switch needs only small inexpensive low power transistors for scanning 90° colour tubes at 25 kv. EHT for a nominal dissipation of only 120 mw. each. Alternatively monochrome 110° 18 kv. picture tubes can be scanned for approximately 90 mw. dissipation per output transistor.

Although work has also been done recently on audio-amplifiers employing transistors in the switching mode, these circuits use a large number of transistors in order to provide the necessary waveforms and do not, of course, make provision for problems peculiar to field deflection circuits (e.g. flyback considerations and raster distortion due to the high-frequency components).

In order that the invention may be readily carried into effect, a specific embodiment will now be described in detail, by way of example, with reference to the accompanying drawings, in which.

The preferred raster-scan arrangement includes conversion means comprising a semiconductor conversion stage and an oscillatory circuit tuned to an even harmonic of the line-scan frequency which circuit provides a wave of sinusoidal form derived from the line time-base for controlling the conversion process, the pulse, appearing in the output circuit, of the conversion stage being applied to an output stage which drives electron beam deflection means via a pulse integrating network. The arrangement is described as applied to a television receiver display operable on 405 or 625 lines.

Figure 1:
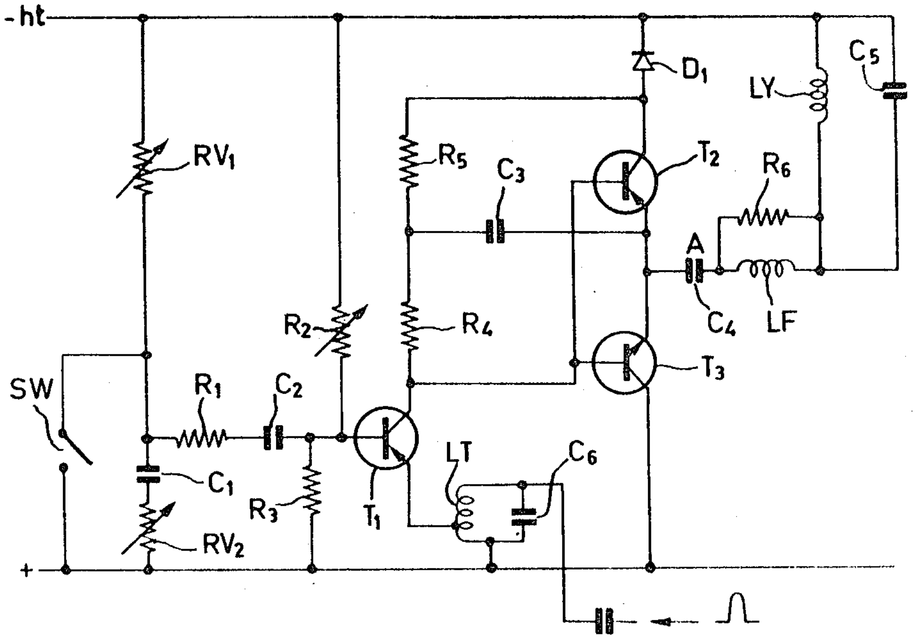
FIGURE 1 shows one possible embodiment of the time-base circuit arrangement.

The circuit arrangement is shown in FIGURE 1 and comprises an oscillator (shown diagrammatically as a switch SW), a conversion stage T1, and two output transistors T2–T3. There is also a resonant circuit $L_T$–C6 in the emitter circuit of T1, tuned to an even harmonic of the line scanning frequency. The arrangement also comprises a charging capacitor C1 included in an RC network with elements R*v*1–R*v*2, and deflection coils L*y*.

THE SCANNING PERIOD

Operation of the circuit during the scanning period will now be described.

Figure 2:
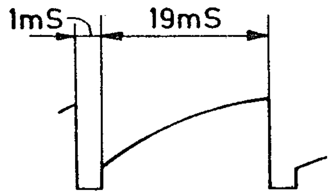
FIGURE 2 shows the more or less sawtooth control voltage for supply to the base of the driver transistor in the arrangement of FIGURE 1.

At the junction of R*v*1 and C1 a negative going sawtooth voltage is present as shown in FIGURE 2 and thus the voltage on the base of T1 tends to rise negatively in the same manner.

The emitter of T1 is tapped at low impedance into the oscillatory circuit $L_T$–C6 which resonates at the 2nd harmonic (or some other even harmonic) of the line scanning frequency.

Figure 3:
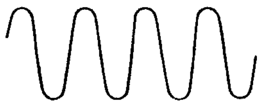
FIGURE 3 shows a sinusoidal voltage active on the emitter of said driver transistor.
Figure 4:
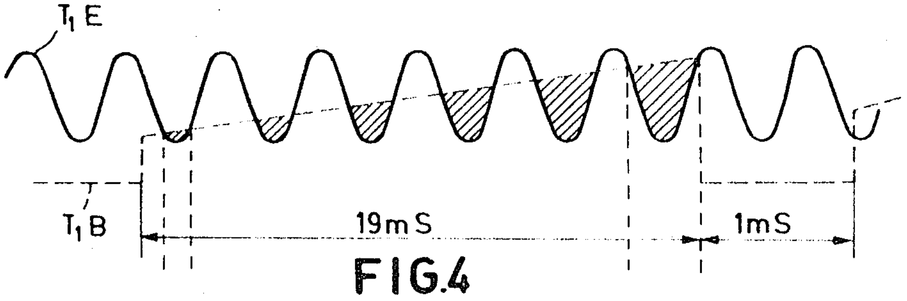
FIGURE 4 shows the total control of the driver transistor by the sawtooth and sinusoidal control voltages.

There is thus a sine-wave present on the emitter of T1 (FIGURE 3). When correctly biased as shown in FIGURE 4, the transistor T1 conducts, i.e. (in the case of a PNP device) during the shaded area of the sine wave when the emitter is more positive than its base. The circuit operating conditions are so arranged that T1 always saturates whenever the emitter becomes more positive than its base, the resultant output pulses being shown in FIGURE 5.

The width of these output pulses of T1 varies substantially proportionally related to the input sawtooth drive.

Figure 5:
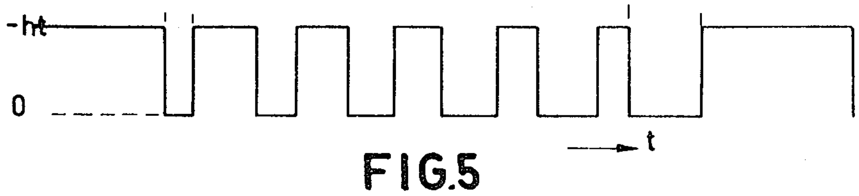
FIGURE 5 shows the pulsed output voltage of the driver transistor.

These pulses are applied to the complementary output pair of transistors T2–T3, the output pulses being taken from the emitter junction of T2–T3 in a similar form to that shown in FIGURE 5. A capacitor C3 is used to speed up to switching operation of T2–T3 thus reducing dissipation during the transition period between the bottoming and cut-off condition.

The output pulses T2–T3 are applied to the deflection coils via a coil $L_F$. Inductance $L_F$ serves first to reduce the high frequency current via C4 which is virtually a short circuit at twice line frequency (C5 is provided for tuning Ly to the correct flyback period) and secondly to ensure that very little high-frequency components appear across the deflection coils which would otherwise give rise to objectionable raster distortion. $L_F$ is, however, quite small, a typical value being between 600 μh and 1 mh. Thus with an input to $L_F$ similar to that shown in FIGURE 5, the voltage appearing across the deflection coils is in the form of a sawtooth due to the integrating effect of $L_F$, R6 and C5.

FLYBACK PERIOD

At the start of the flyback the discharge path SW of the capacitor C1 conducts so that the junction of C1–Rv1 is almost instantaneously at ground potential due to the voltage step shown in FIGURE 2. This voltage step is applied to the base of T1 and ensures that T1 is rapidly cut off during the flyback period (see FIGURES 4 and 5). Since T1 is cut off, the voltage of its collector rises towards HT thus tending to cut off T3.

Now the stored energy in the inductance of coils Ly causes the voltage at point A to rise negatively. As R4 is connected to C4 via C3 (and thus point A) the potentials of the base (and emitter) of T3 also go negative thus preventing T3 from conducting. On the other hand the potential of the base of T2 is rising negatively thus causing the transistor to conduct. This would, of course, prevent a fast flyback since the emitter of T2 would be effectively clamped to the HT supply, thus damping the flyback of the voltage across the deflection coils. If, however, a diode D1 is inserted in the collector lead of T2, said diode cuts off as soon as the anode voltage rises above the HT value.

Figure 6:
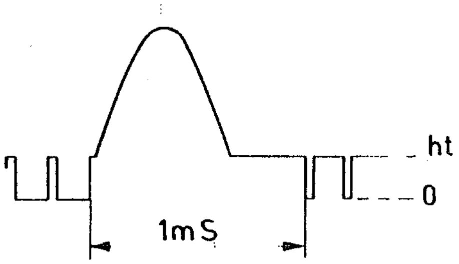
FIGURE 6 shows the output voltage of the output stage controlled by the driver transistor during the vertical flyback.

Since T2 and T1 are both now isolated from the HT supply by means of D1 and since T3 and T1 are both cut off, and the oscillatory circuit Ly–C5 is tuned to the flyback frequency, i.e. a period of about 1 ms., the voltage across Ly–C5 is free to rise to a high value in the form of a half sine-wave. As soon as the voltage across Ly reverses and falls below the HT value, D1 and T2 will conduct and a clamping period then occurs until the coil current has reversed. Therefore the waveform shown in FIGURE 5 is modified during flyback to that shown in FIGURE 6.

GENERAL CIRCUIT CONSIDERATIONS

Having described circuits using transistors in the switching mode, it is now possible to consider in more detail some of the circuit problems.

One of the factors determining the overall efficiency of the circuit will be maximum-minimum pulse width ratio obtainable (i.e. depth of modulation). For a sine-wave input to the emitter of T1 this will be somewhat limited due to the slow rate of change of voltage at the top and bottom of the sine-wave. It has been found that sawtooth voltage amplitudes of just under half the HT supply voltage are still permissible consistent with linearity considerations.

The maximum depth of modulation could be improved, if desired, by (a) modifying the oscillatory circuit $L_T$–C6 so that a further resonance occurs at, say, the 3rd harmonic of the resonance frequency of the tuned circuit (e.g. 3×2×10 kc.=60 kc. in the case of 405 lines) or (b) by possibly arranging for saturation to occur in the tuned circuit at peaks of the sine-wave.

It should be asked at this stage, however, if maximum efficiency in terms of power drawn from the supply is necessary in a main-operated television receiver. The answer is almost certainly in the negative provided it does not influence the choice of transistors in the output stage. As a typical example, if the efficiency were improved by either of the methods suggested, the nominal power dissipation per transistor would typically be reduced from approximately 120 mw. to perhaps 90 mw. for 90° colour tube deflection.

Such a reduction in dissipation would not in fact influence the choice of transistors. On this basis it is therefore undesirable to increase the cost and complexity of the tuned circuit.

A further point is that it is in fact advantageous to utilize a fundamental sine-wave due to the ease with which correct linearity of scan may be achieved from a simple R.C. network (i.e. Rv1–C1). The output of such a network is exponential (see FIGURE 2) which, in a linear amplifier system, would give rise to bad linearity due to the cramping at the end of scan and stretching at start of scan.

However, with a sine-wave input and an exponential sawtooth voltage, it is possible to have S correction due the slow rate of change at the peaks of the sine-wave. By correcting biassing T1 by means of R2, compensation for the non-linear input sawtooth can be obtained in a simple manner without the need for additional linearity feedback arrangements.

It should be noted that the sine-wave should be an even harmonic of the line scanning frequency since, if the fundamental or an odd harmonic is used, non-interlace will normally occur.

Due to the presence of the diode D1 in the collector lead of T2 for flyback reasons the voltage across $L_F$ tends to go more negative than the HT voltage towards the end of scan, this being due to reversal of current at pulse frequency in $L_F$. This gives rise to non-linearity of scan since the level of the 50 c./s. sawtooth voltage across Ly is altered in an unwanted manner.

This is overcome by shunting $L_F$ by a resistor R6 (e.g. a VDR or voltage-dependent resistor) since this gives better results than the alternative of shunting $D_1$ by a capacitor, which later tends to affect the flyback oscillation.

A further reduction in switching time of T1, T2 and T3 may be effected by feedback via a secondary winding coupling $L_F$ to the base of T1 in such a polarity as to aid switching. It is not considered, however, that the small improvements obtained justify the extra winding in normal circumstances.

In passing, it is useful to note that the distortion problems caused in Class B amplifiers by overlapping of the characteristic curves, do not occur with transistors when operating in the switching mode.

One set of practical values and components suitable for the arrangement of FIGURE 1 will now be given by way of example:

TABLE

| | |
|---|---|
| Transistors: | |
| T1 | Mullard type ACY17. |
| T2 | Mullard type OC81. |
| T3 | Mullard type BFY50. |
| Diode D1 | Mullard type OA10. |
| Deflection coil Ly | 21 mh. with a resistance of 9 ohms. |
| Inductance: | |
| $L_F$ | 600 μh. |
| $L_T$ | As required for tuning. |
| Capacitors: | |
| C1 | 50 μf. |
| C2 | 200 μf. |
| C3 | 200 μf. |
| C4 | 200 μf. |

| | |
|---|---|
| C5 | 1 $\mu$f. |
| C6 | As required for tuning. |
| Resistors: | |
| Rv1 | 10K. |
| Rv2 | 18 ohms. |
| R1 | 220 ohms. |
| R2 | 50K. |
| R3 | 470 ohms. |
| R4 | 390 ohms. |
| R5 | 100 ohms. |
| R6 | 33 ohms, approximately. |

The circuit of FIGURE 1 will work satisfactorily, as regards linearity, without adding further components. However, under certain limit of fault conditions excessive base current could flow into the base of transistor T3 via transistor T1. To render the circuit safe against this eventuality, it is necessary to add suitable circuit components. One possibility is to add a small resistor (for example, 50 ohms) in the base circuit of T3 (e.g. between $L_T$–C6 and T1 or in the connection between $L_T$–C6 and ground). As a result, linearity ise slightly disturbed, but this can be remedied by also adding a small resistor (for example, 5–10 ohms) in the collector lead of T3. The latter resistor also provides a degree of safety in the event of breakdown in transistor T2 or T3. With two additional resistors arranged in this manner, it is desirable to add a capacitor across the first resistor (50 ohms) for the sake of still better linearity, the value being, for example, 0.47 $\mu$f.

The switch SW may be designed, for example, as a blocking oscillator or a p-n-p-n switching transistor controlled by triggering pulses.

Whereas the arrangement of FIGURE 1 has been described as employing transistors T1–T3, a generally similar circuit arrangement can be designed to employ 4-layer semiconductors (e.g. controlled, gate turn-off silicon rectifiers) in place of transistors.

Whereas the arrangement of FIGURE 1 employs the sawtooth drive on the base of T1 and the sine-wave on its emitter, these signals can be changed over or they may both be applied to the same electrode in a slightly modified circuit.

Furthermore, the output circuit designed as a quasi push-pull circuit can be modified so as to employ transistors T2–T3 of the same conductivity type. In this case signals of opposite polarity must be applied to the bases of transistors T2 and T3, which may be effected with the aid of an appropriate phase-converting stage. Although the base of T1 is coupled via C2 to charge capacitor C1 with respect to alternating current, it is also possible to establish a DC coupling by omitting capacitor C2, so that the resistors R2 and R3 can be dispensed with.

It will also be clear that instead of a single ended push-pull output stage with two transistors, choke coupling can be used. That means either transistor $T_2$ together with diode $D_1$ or transistor $T_3$ can be replaced by a choke.

The use of a single ended push-pull output stage, however, has the advantage that a real impulse like voltage as shown in FIG. 5 is obtained, whereas with choke coupling some undesired ringing may occur.

What is claimed is:

1. A field time base circuit for a television system comprising:

means for generating a sawtooth shaped waveform signal;

means for converting said sawtooth signal to a pulse train wherein each of said pulses has a width proportional to the instantaneous amplitude of said sawtooth signal including a semiconductor device having control, common and output electrodes, said control electrode being coupled to said sawtooth generator, an inductance-capacitance resonant circuit coupled to said common electrode activated by said sawtooth generator, means for biasing said semiconductor device to saturate when conducting, whereby said pulse train is produced at said output electrode;

a semiconductor output stage having input and output terminals, said input terminal coupled to said output electrode;

and integrating means coupled to said output terminal, whereby said pulse train will be integrated to form a sawtooth field time base circuit.

2. A field time-base circuit for a television system, comprising deflection coil means, a source of sawtooth waveform signals, a first semiconductor device having input, common and output electrodes, means applying said sawtooth waveform signal to said input electrode, oscillatory circuit means connected to said common electrode whereby current pulses flow in said semiconductor device and the widths of said current pulses are responsive to the instantaneous amplitude of said sawtooth waveform signal, a semiconductor output stage comprising at least a second semiconductor device having control, common and output electrodes, means connecting said output electrode to said control electrode, and integrating circuit means connecting said output electrode of said second semiconductor device to said deflection coil means, whereby high frequency components of signals applied to said deflection coil means are reduced.

3. The field time-base circuit of claim 2, in which said oscillatory circuit means has a resonant frequency that is an even harmonic of the line scan frequency of said television system.

4. A field time-base circuit for a television system, comprising deflection coil means, a source of sawtooth waveform signals, a first semiconductor device having input, common and output electrodes, means applying said sawtooth waveform signal to said input electrode, oscillatory circuit means connected to said common electrode whereby current pulses flow in said first semiconductor device and the widths of said current pulses are responsive to the instantaneous amplitude of said sawtooth waveform signal, a semiconductor output stage comprising second and third semiconductor devices of different conductivity type with respect to each other, each of said second and third devices having an input, common and output electrode, a source of operating potential, means serially connecting the common-output electrode paths of said second and third devices to said source of operating potential, means connecting the output electrode of said first device to the input electrodes of said second and third devices, and means connecting said deflection coil means to the junction of said common output electrode paths.

5. The circuit of claim 4, in which said means connecting said deflection coil means comprises pulse integrating circuit means.

6. The circuit of claim 4, comprising diode means connected between said source of operating potential and the output electrode of said second semiconductor device, said diode being poled to be cut off during at least a portion of the flyback period to prevent clamping of the common electrode of said second semiconductor device to the voltage of said source of operating voltage.

References Cited

UNITED STATES PATENTS

| | | | |
|---|---|---|---|
| 3,343,006 | 9/1967 | Attwood | 315—27 |
| 3,287,505 | 10/1966 | Fukamachi | 307—261 X |
| 3,181,074 | 4/1965 | Cotterell | 307—265 X |
| 3,048,714 | 8/1962 | Poole | 307—228 |

RODNEY D. BENNETT, Jr., Primary Examiner

J. G. BAXTER, Assistant Examiner

U.S. Cl. X.R.

307—261, 265; 325—142